United States Patent
Castillo et al.

(10) Patent No.: US 9,031,103 B2
(45) Date of Patent: *May 12, 2015

(54) TEMPERATURE MEASUREMENT AND CONTROL FOR LASER AND LIGHT-EMITTING DIODES

(71) Applicant: Microsoft Corporation, Redmond, WA (US)

(72) Inventors: Leo Del Castillo, Carnation, WA (US); Dawson Yee, Medina, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/072,492

(22) Filed: Nov. 5, 2013

(65) Prior Publication Data

US 2014/0056322 A1     Feb. 27, 2014

Related U.S. Application Data

(63) Continuation of application No. 12/751,877, filed on Mar. 31, 2010, now Pat. No. 8,605,763.

(51) Int. Cl.
*H01S 3/04*     (2006.01)
*H01S 5/068*     (2006.01)
(Continued)

(52) U.S. Cl.
CPC ......... *H01S 5/06804* (2013.01); *H01S 5/02415* (2013.01); *H01S 5/0617* (2013.01); *H01S 5/0683* (2013.01); *H01S 5/06837* (2013.01); *H05B 33/0854* (2013.01)

(58) Field of Classification Search
USPC ............ 372/34, 29.015, 29.011, 38.02, 38.07
See application file for complete search history.

(56) References Cited

U.S. PATENT DOCUMENTS 4,604,753 A    8/1986    Sawai
4,627,620 A    12/1986    Yang
(Continued)

FOREIGN PATENT DOCUMENTS

CN    101254344 B    6/2010
EP    0583061 A2    2/1994
(Continued)

OTHER PUBLICATIONS

Kanade et al., "A Stereo Machine for Video-rate Dense Depth Mapping and Its New Applications", IEEE Computer Society Conference on Computer Vision and Pattern Recognition, 1996, pp. 196-202,The Robotics Institute, Carnegie Mellon University, Pittsburgh, PA.
(Continued)

*Primary Examiner* — Kinam Park
(74) *Attorney, Agent, or Firm* — Ladislav Kusnyer; Judy Yee; Micky Minhas

(57) ABSTRACT

The existing diodes in an LED or laser diode package are used to measure the junction temperature of the LED or laser diode. The light or laser emissions of a diode are switched off by removing the operational drive current applied to the diode package. A reference current, which can be lower the operational drive current, is applied to the diode package. The resulting forward voltage of the diode is measured using a voltage measurement circuit. Using the inherent current-voltage-temperature relationship of the diode, the actual junction temperature of the diode can be determined. The resulting forward voltage can be used in a feedback loop to provide temperature regulation of the diode package, with or without determining the actual junction temperature. The measured forward voltage of a photodiode or the emissions diode in a diode package can be used to determine the junction temperature of the emissions diode.

20 Claims, 8 Drawing Sheets

(51) Int. Cl.
*H05B 33/08* (2006.01)
*H01S 5/024* (2006.01)
*H01S 5/06* (2006.01)
*H01S 5/0683* (2006.01)

(56) References Cited

U.S. PATENT DOCUMENTS

| | | | |
|---|---|---|---|
| 4,630,910 A | 12/1986 | Ross et al. | |
| 4,645,458 A | 2/1987 | Williams | |
| 4,695,953 A | 9/1987 | Blair et al. | |
| 4,702,475 A | 10/1987 | Elstein et al. | |
| 4,711,543 A | 12/1987 | Blair et al. | |
| 4,751,642 A | 6/1988 | Silva et al. | |
| 4,796,997 A | 1/1989 | Svetkoff et al. | |
| 4,809,065 A | 2/1989 | Harris et al. | |
| 4,817,950 A | 4/1989 | Goo | |
| 4,837,428 A | 6/1989 | Takagi et al. | |
| 4,843,568 A | 6/1989 | Krueger et al. | |
| 4,893,183 A | 1/1990 | Nayar | |
| 4,901,362 A | 2/1990 | Terzian | |
| 4,925,189 A | 5/1990 | Braeunig | |
| 5,101,444 A | 3/1992 | Wilson et al. | |
| 5,148,154 A | 9/1992 | MacKay et al. | |
| 5,184,295 A | 2/1993 | Mann | |
| 5,229,754 A | 7/1993 | Aoki et al. | |
| 5,229,756 A | 7/1993 | Kosugi et al. | |
| 5,239,463 A | 8/1993 | Blair et al. | |
| 5,239,464 A | 8/1993 | Blair et al. | |
| 5,288,078 A | 2/1994 | Capper et al. | |
| 5,295,491 A | 3/1994 | Gevins | |
| 5,320,538 A | 6/1994 | Baum | |
| 5,347,306 A | 9/1994 | Nitta | |
| 5,385,519 A | 1/1995 | Hsu et al. | |
| 5,405,152 A | 4/1995 | Katanics et al. | |
| 5,417,210 A | 5/1995 | Funda et al. | |
| 5,423,554 A | 6/1995 | Davis | |
| 5,454,043 A | 9/1995 | Freeman | |
| 5,469,740 A | 11/1995 | French et al. | |
| 5,495,576 A | 2/1996 | Ritchey | |
| 5,516,105 A | 5/1996 | Eisenbrey et al. | |
| 5,524,637 A | 6/1996 | Erickson et al. | |
| 5,534,917 A | 7/1996 | MacDougall | |
| 5,563,988 A | 10/1996 | Maes et al. | |
| 5,577,981 A | 11/1996 | Jarvik | |
| 5,580,249 A | 12/1996 | Jacobsen et al. | |
| 5,594,469 A | 1/1997 | Freeman et al. | |
| 5,597,309 A | 1/1997 | Riess | |
| 5,616,078 A | 4/1997 | Oh | |
| 5,617,312 A | 4/1997 | Iura et al. | |
| 5,638,300 A | 6/1997 | Johnson | |
| 5,641,288 A | 6/1997 | Zaenglein | |
| 5,682,196 A | 10/1997 | Freeman | |
| 5,682,229 A | 10/1997 | Wangler | |
| 5,690,582 A | 11/1997 | Ulrich et al. | |
| 5,703,367 A | 12/1997 | Hashimoto et al. | |
| 5,704,837 A | 1/1998 | Iwasaki et al. | |
| 5,706,303 A | 1/1998 | Lawrence | |
| 5,715,834 A | 2/1998 | Bergamasco et al. | |
| 5,825,794 A | 10/1998 | Ogino et al. | |
| 5,875,108 A | 2/1999 | Hoffberg et al. | |
| 5,877,803 A | 3/1999 | Wee et al. | |
| 5,913,727 A | 6/1999 | Ahdoot | |
| 5,933,125 A | 8/1999 | Fernie | |
| 5,980,256 A | 11/1999 | Carmein | |
| 5,989,157 A | 11/1999 | Walton | |
| 5,995,649 A | 11/1999 | Marugame | |
| 6,005,548 A | 12/1999 | Latypov et al. | |
| 6,009,210 A | 12/1999 | Kang | |
| 6,054,991 A | 4/2000 | Crane et al. | |
| 6,066,075 A | 5/2000 | Poulton | |
| 6,072,494 A | 6/2000 | Nguyen | |
| 6,073,489 A | 6/2000 | French et al. | |
| 6,077,201 A | 6/2000 | Cheng | |
| 6,098,458 A | 8/2000 | French et al. | |
| 6,100,896 A | 8/2000 | Strohecker et al. | |
| 6,101,289 A | 8/2000 | Kellner | |
| 6,128,003 A | 10/2000 | Smith et al. | |
| 6,130,677 A | 10/2000 | Kunz | |
| 6,141,463 A | 10/2000 | Covell et al. | |
| 6,147,678 A | 11/2000 | Kumar et al. | |
| 6,152,856 A | 11/2000 | Studor et al. | |
| 6,159,100 A | 12/2000 | Smith | |
| 6,173,066 B1 | 1/2001 | Peurach et al. | |
| 6,181,343 B1 | 1/2001 | Lyons | |
| 6,188,132 B1 | 2/2001 | Shih et al. | |
| 6,188,777 B1 | 2/2001 | Darrell et al. | |
| 6,215,890 B1 | 4/2001 | Matsuo et al. | |
| 6,215,898 B1 | 4/2001 | Woodfill et al. | |
| 6,226,396 B1 | 5/2001 | Marugame | |
| 6,229,913 B1 | 5/2001 | Nayar et al. | |
| 6,256,033 B1 | 7/2001 | Nguyen | |
| 6,256,400 B1 | 7/2001 | Takata et al. | |
| 6,283,860 B1 | 9/2001 | Lyons et al. | |
| 6,289,112 B1 | 9/2001 | Jain et al. | |
| 6,299,308 B1 | 10/2001 | Voronka et al. | |
| 6,308,565 B1 | 10/2001 | French et al. | |
| 6,316,934 B1 | 11/2001 | Amorai-Moriya et al. | |
| 6,363,160 B1 | 3/2002 | Bradski et al. | |
| 6,384,819 B1 | 5/2002 | Hunter | |
| 6,411,744 B1 | 6/2002 | Edwards | |
| 6,430,997 B1 | 8/2002 | French et al. | |
| 6,476,834 B1 | 11/2002 | Doval et al. | |
| 6,496,598 B1 | 12/2002 | Harman | |
| 6,503,195 B1 | 1/2003 | Keller et al. | |
| 6,539,931 B2 | 4/2003 | Trajkovic et al. | |
| 6,570,555 B1 | 5/2003 | Prevost et al. | |
| 6,612,738 B2 | 9/2003 | Beer et al. | |
| 6,633,294 B1 | 10/2003 | Rosenthal et al. | |
| 6,640,202 B1 | 10/2003 | Dietz et al. | |
| 6,661,918 B1 | 12/2003 | Gordon et al. | |
| 6,681,031 B2 | 1/2004 | Cohen et al. | |
| 6,714,665 B1 | 3/2004 | Hanna et al. | |
| 6,731,799 B1 | 5/2004 | Sun et al. | |
| 6,738,066 B1 | 5/2004 | Nguyen | |
| 6,765,726 B2 | 7/2004 | French et al. | |
| 6,788,809 B1 | 9/2004 | Grzeszczuk et al. | |
| 6,801,637 B2 | 10/2004 | Voronka et al. | |
| 6,807,202 B1 | 10/2004 | Plamper et al. | |
| 6,813,102 B2 | 11/2004 | Furuichi et al. | |
| 6,873,723 B1 | 3/2005 | Aucsmith et al. | |
| 6,876,496 B2 | 4/2005 | French et al. | |
| 6,937,742 B2 | 8/2005 | Roberts et al. | |
| 6,950,534 B2 | 9/2005 | Cohen et al. | |
| 7,003,134 B1 | 2/2006 | Covell et al. | |
| 7,036,094 B1 | 4/2006 | Cohen et al. | |
| 7,038,855 B2 | 5/2006 | French et al. | |
| 7,039,676 B1 | 5/2006 | Day et al. | |
| 7,042,440 B2 | 5/2006 | Pryor et al. | |
| 7,050,606 B2 | 5/2006 | Paul et al. | |
| 7,058,204 B2 | 6/2006 | Hildreth et al. | |
| 7,060,957 B2 | 6/2006 | Lange et al. | |
| 7,113,918 B1 | 9/2006 | Ahmad et al. | |
| 7,121,946 B2 | 10/2006 | Paul et al. | |
| 7,170,492 B2 | 1/2007 | Bell | |
| 7,184,048 B2 | 2/2007 | Hunter | |
| 7,202,898 B1 | 4/2007 | Braun et al. | |
| 7,222,078 B2 | 5/2007 | Abelow | |
| 7,227,526 B2 | 6/2007 | Hildreth et al. | |
| 7,259,747 B2 | 8/2007 | Bell | |
| 7,308,112 B2 | 12/2007 | Fujimura et al. | |
| 7,315,461 B2 | 1/2008 | Kyono | |
| 7,317,836 B2 | 1/2008 | Fujimura et al. | |
| 7,348,963 B2 | 3/2008 | Bell | |
| 7,359,121 B2 | 4/2008 | French et al. | |
| 7,367,887 B2 | 5/2008 | Watabe et al. | |
| 7,379,563 B2 | 5/2008 | Shamaie | |
| 7,379,566 B2 | 5/2008 | Hildreth | |
| 7,389,591 B2 | 6/2008 | Jaiswal et al. | |
| 7,412,077 B2 | 8/2008 | Li et al. | |
| 7,421,093 B2 | 9/2008 | Hildreth et al. | |
| 7,430,312 B2 | 9/2008 | Gu | |
| 7,436,496 B2 | 10/2008 | Kawahito | |
| 7,450,736 B2 | 11/2008 | Yang et al. | |
| 7,452,275 B2 | 11/2008 | Kuraishi | |

(56) References Cited

U.S. PATENT DOCUMENTS

| | | | |
|---|---|---|---|
| 7,457,335 | B2 | 11/2008 | Randlett |
| 7,460,690 | B2 | 12/2008 | Cohen et al. |
| 7,489,812 | B2 | 2/2009 | Fox et al. |
| 7,536,032 | B2 | 5/2009 | Bell |
| 7,555,142 | B2 | 6/2009 | Hildreth et al. |
| 7,560,701 | B2 | 7/2009 | Oggier et al. |
| 7,570,805 | B2 | 8/2009 | Gu |
| 7,574,020 | B2 | 8/2009 | Shamaie |
| 7,576,727 | B2 | 8/2009 | Bell |
| 7,590,262 | B2 | 9/2009 | Fujimura et al. |
| 7,593,552 | B2 | 9/2009 | Higaki et al. |
| 7,598,942 | B2 | 10/2009 | Underkoffler et al. |
| 7,607,509 | B2 | 10/2009 | Schmiz et al. |
| 7,620,202 | B2 | 11/2009 | Fujimura et al. |
| 7,628,507 | B2 | 12/2009 | Allen et al. |
| 7,642,516 | B2 | 1/2010 | Stein et al. |
| 7,668,340 | B2 | 2/2010 | Cohen et al. |
| 7,680,298 | B2 | 3/2010 | Roberts et al. |
| 7,683,954 | B2 | 3/2010 | Ichikawa et al. |
| 7,684,592 | B2 | 3/2010 | Paul et al. |
| 7,701,439 | B2 | 4/2010 | Hillis et al. |
| 7,702,130 | B2 | 4/2010 | Im et al. |
| 7,704,135 | B2 | 4/2010 | Harrison, Jr. |
| 7,710,391 | B2 | 5/2010 | Bell et al. |
| 7,729,530 | B2 | 6/2010 | Antonov et al. |
| 7,746,345 | B2 | 6/2010 | Hunter |
| 7,760,182 | B2 | 7/2010 | Ahmad et al. |
| 7,809,167 | B2 | 10/2010 | Bell |
| 7,834,846 | B1 | 11/2010 | Bell |
| 7,852,262 | B2 | 12/2010 | Namineni et al. |
| RE42,256 | E | 3/2011 | Edwards |
| 7,898,522 | B2 | 3/2011 | Hildreth et al. |
| 8,035,612 | B2 | 10/2011 | Bell et al. |
| 8,035,614 | B2 | 10/2011 | Bell et al. |
| 8,035,624 | B2 | 10/2011 | Bell et al. |
| 8,072,470 | B2 | 12/2011 | Marks |
| 8,605,763 | B2 * | 12/2013 | Castillo et al. .................. 372/34 |
| 2005/0082553 | A1 | 4/2005 | Yamamoto et al. |
| 2006/0239558 | A1 | 10/2006 | Rafii et al. |
| 2007/0030868 | A1 | 2/2007 | Sekigawa |
| 2008/0026838 | A1 | 1/2008 | Dunstan et al. |
| 2008/0205482 | A1 | 8/2008 | Cao et al. |
| 2011/0031903 | A1 | 2/2011 | Nguyen et al. |
| 2011/0243167 | A1 | 10/2011 | Castillo et al. |

FOREIGN PATENT DOCUMENTS

| | | | |
|---|---|---|---|
| JP | 08044490 | A1 | 2/1996 |
| WO | 93/10708 | A1 | 6/1993 |
| WO | 97/17598 | A1 | 5/1997 |
| WO | 99/44698 | A1 | 9/1999 |
| WO | WO2009/044340 | A2 | 4/2009 |
| WO | WO2009/095853 | A2 | 8/2009 |

OTHER PUBLICATIONS

Miyagawa et al., "CCD-Based Range Finding Sensor", Oct. 1997, pp. 1648-1652, vol. 44 No. 10, IEEE Transactions on Electron Devices.

Rosenhahn et al., "Automatic Human Model Generation", 2005, pp. 41-48, University of Auckland (CITR), New Zealand.

Aggarwal et al., "Human Motion Analysis: A Review", IEEE Non-rigid and Articulated Motion Workshop, 1997, University of Texas at Austin, Austin, TX.

Shao et al., "An Open System Architecture for a Multimedia and Multimodal User Interface", Aug. 24, 1998, Japanese Society for Rehabilitation of Persons with Disabilities (JSRPD), Japan.

Kohler, "Special Topics of Gesture Recognition Applied in Intelligent Home Environments", In Proceedings of the Gesture Workshop, 1998, pp. 285-296, Germany.

Kohler, "Vision Based Remote Control in Intelligent Home Environments", University of Erlangen-Nuremberg/Germany, 1996, pp. 147-154, Germany.

Kohler, "Technical Details and Ergonomical Aspects of Gesture Recognition applied in Intelligent Home Environments", 1997, Germany.

Hasegawa et al., "Human-Scale Haptic Interaction with a Reactive Virtual Human in a Real-Time Physics Simulator", Jul. 2006, vol. 4, No. 3, Article 6C, ACM Computers in Entertainment, New York, NY.

Qian et al., "A Gesture-Driven Multimodal Interactive Dance System", Jun. 2004, pp. 1579-1582, IEEE International Conference on Multimedia and Expo (ICME), Taipei, Taiwan.

Zhao, "Dressed Human Modeling, Detection, and Parts Localization", 2001, The Robotics Institute, Carnegie Mellon University, Pittsburgh, PA.

He, "Generation of Human Body Models", Apr. 2005, University of Auckland, New Zealand.

Isard et al., "Condensation—Conditional Density Propagation for Visual Tracking", 1998, pp. 5-28, International Journal of Computer Vision 29(1), Netherlands.

Livingston, "Vision-based Tracking with Dynamic Structured Light for Video See-through Augmented Reality", 1998, University of North Carolina at Chapel Hill, North Carolina, USA.

Wren et al., "Pfinder: Real-Time Tracking of the Human Body", MIT Media Laboratory Perceptual Computing Section Technical Report No. 353, Jul. 1997, vol. 19, No. 7, pp. 780-785, IEEE Transactions on Pattern Analysis and Machine Intelligence, Caimbridge, MA.

Breen et al., "Interactive Occlusion and Collision of Real and Virtual Objects in Augmented Reality", Technical Report ECRC-95-02, 1995, European Computer-Industry Research Center GmbH, Munich, Germany.

Freeman et al., "Television Control by Hand Gestures", Dec. 1994, Mitsubishi Electric Research Laboratories, TR94-24, Caimbridge, MA.

Hongo et al., "Focus of Attention for Face and Hand Gesture Recognition Using Multiple Cameras", Mar. 2000, pp. 156-161, 4th IEEE International Conference on Automatic Face and Gesture Recognition, Grenoble, France.

Pavlovic et al., "Visual Interpretation of Hand Gestures for Human-Computer Interaction: A Review", Jul. 1997, pp. 677-695, vol. 19, No. 7, IEEE Transactions on Pattern Analysis and Machine Intelligence.

Azarbayejani et al., "Visually Controlled Graphics", Jun. 1993, vol. 15, No. 6, IEEE Transactions on Pattern Analysis and Machine Intelligence.

Granieri et al., "Simulating Humans in VR", The British Computer Society, Oct. 1994, Academic Press.

Brogan et al., "Dynamically Simulated Characters in Virtual Environments", Sep./Oct. 1998, pp. 2-13, vol. 18, Issue 5, IEEE Computer Graphics and Applications.

Fisher et al., "Virtual Environment Display System", ACM Workshop on Interactive 3D Graphics, Oct. 1986, Chapel Hill, NC.

"Virtual High Anxiety", Tech Update, Aug. 1995, pp. 22.

Sheridan et al., "Virtual Reality Check", Technology Review, Oct. 1993, pp. 22-28, vol. 96, No. 7.

Stevens, "Flights into Virtual Reality Treating Real World Disorders", The Washington Post, Mar. 27, 1995, Science Psychology, 2 pages.

"Simulation and Training", 1994, Division Incorporated.

English Machine-translation of Japanese Publication No. JP08-044490 published on Feb. 16, 1996.

"Notice of Allowance Received for China Patent Application No. 201110087043.4", Mailed Date: Dec. 30, 2013, Filed Date: Mar. 30, 2011, 6 Pages.

"Second Office Action Received in China Patent Application No. 201110087043.4", Mailed Date: Sep. 9, 2013, Filed Date: Mar. 30, 2011, 6 pages.

Smith, Matt, et al., "Measuring temperatures on computer chips with speed and accuracy," Analog Dialogue 33-4, Analog Devices, Apr. 1999, 5 pages.

Giribet, Xavier Perpina, "Internal IR-laser Deflection Measurements of Temperature and Free-Carrier Concentration in Power Devices," Universitat Autonoma de Barcelona, May 27, 2005, 143 pages.

(56) References Cited

OTHER PUBLICATIONS

Gu, Yimin, et al., "A non-contact method for determining junction temperature of phosphor-converted white LEDs," Third International Conference on Solid State Lighting, Proceedings of SPIE 5187: 107-114, 2004, 9 pages.
MIC3000 FOM Management IC, Micrel, Inc., Oct. 2004, 68 pages.
Jeong, Jung Hwa, et al., "Junction Temperature Measurement of InAs Quantum-Dot Laser Diodes by Utilizing Voltage-Temperature Method," IEEE Photonics Technology Letters, vol. 20, No. 16, Aug. 15, 2008, 3 pages.
Toyama, Kentaro, et al., "Probabilistic Tracking in a Metric Space," Eighth International Conference on Computer Vision, Vancouver, Canada, vol. 2, Jul. 2001, 8 pages.
Non-final Office Action dated Dec. 17, 2012, U.S. Appl. No. 12/751,877, filed Mar. 31, 2010.
Response to Office Action dated Mar. 19, 2013, U.S. Appl. No. 12/751,877, filed Mar. 31, 2010.
Chinese Office Action dated Jan. 14, 2013, Chinese Patent Application No. 201110087043.4.
Notice of Allowance and Fee(s) Due dated Aug. 6, 2013, U.S. Appl. No. 12/751,877, filed Mar. 31, 2010.

\* cited by examiner

TEMPERATURE MEASUREMENT AND CONTROL FOR LASER AND LIGHT-EMITTING DIODES

CLAIM OF PRIORITY

This application is a continuation of U.S. patent application Ser. No. 12/751,877, entitled "TEMPERATURE MEASUREMENT AND CONTROL FOR LASER AND LIGHT-EMITTING DIODES," filed Mar. 31, 2010, now issued as U.S. Pat. No. 8,605,763, and incorporated by reference herein in its entirety.

BACKGROUND

Semiconductor light-emitting devices such as light-emitting diodes (LEDs) and laser emitting devices such as laser diodes are used in an increasing number of applications. LEDs, for instance, are widely used in general illumination applications while laser diodes are commonly used in long-distance communication applications, optical applications and various imaging applications. As the use of these devices has increased, so too have various application demands for more precise operation of the devices. LEDs need to meet particular brightness, stable light point and ratio of light output requirements, and laser diodes need to meet particular lasing wavelength requirements, both while maintaining adequate operational lives.

Among the operational requirements of both LEDs and laser diodes is a minimum degree of temperature control. In LEDs, light output varies with the junction temperature of the LED, affecting intensity and causing spectral shift. In laser diodes, the emission wavelength varies with the junction temperature of the laser diode. Generally, the power delivered to the LED or laser diode package is controlled by a feedback loop that includes an estimation of the temperature of the package. One or more thermal sensors are often attached to the package to estimate the operating temperature. A thermistor or thermocouple may be used, for example. Among the deficiencies of such a thermal sensor is its lack of proximity to the semiconductor die in which the diode is formed, which can result in errors when estimating junction temperature. This lack of precision may not be acceptable in many of today's applications for LEDs and laser diodes.

SUMMARY

The existing and inherent diodes in a light-emitting diode or laser diode package are used to measure the junction temperature of the LED or laser diode, hereinafter referred to generally as emission diodes. The light or laser emissions of the diode are switched off by removing the operational drive current applied to the diode package. A reference current, which can be lower than the operational drive current, is applied to the diode package. The resulting forward voltage of the emissions diode is measured using a voltage measurement circuit. Using the inherent current-voltage-temperature relationship of the emissions diode, the actual junction temperature of the emissions diode can be determined. The resulting forward voltage can be used in a feedback loop to provide temperature regulation of the diode package, with or without determining the actual junction temperature.

In packages including a monitor photodiode for measuring the emissions of the LED or laser diode, the reference current can be applied to the photodiode in place of or in addition to the emission diode, followed by measuring the forward voltage across the photodiode. The measured temperature of the photodiode can be used in place of or in combination with the measured temperature of the emission diode to determine the emission diode junction temperature.

One embodiment includes operating an emissions diode for junction temperature determination. A drive current is applied to the emissions diode at a level sufficient to enable emissions by the emissions diode. After driving the emissions diode, the drive current is removed and a reference current is applied to the emissions diode at a level less than the drive current level. With the reference current applied, the forward voltage level of the emissions diode is measured. Using the measured forward voltage level, an operating temperature of the emissions diode is controlled. Controlling the operating temperature can include determining a junction temperature of the emissions diode based on the measured forward voltage level and the reference current level.

One embodiment includes driver circuitry for an emissions diode. The driver circuitry includes at least one current source, at least one measurement circuit and at least one control circuit. The current source supplies a drive current for the emissions diode and a reference current for a photodiode in a diode package with the emissions diode. The voltage measurement circuit measures a forward voltage of the photodiode while the reference current is applied to the photodiode. The control circuit regulates an operating temperature of the diode package based on the measured forward voltage of the photodiode.

The temperature measurement and control can be used in many applications, such as for creating depth images in systems utilizing laser diode light sources. Accordingly, one embodiment includes driving a light source including a laser diode in a diode package having a photodiode by applying a drive current to the laser diode to cause emissions at a predetermined wavelength. One or more objects are illuminated with the light source at the predetermined wavelength. One or more depth images including the one or more objects are sensed or created while illuminating the one or more objects. A reference current is applied to the diode package followed by measuring a forward voltage across the laser diode and/or the photodiode. The temperature of the diode package is controlled based on the forward voltage across the laser diode and/or the photodiode to maintain emissions by the laser diode at the predetermined wavelength.

This summary is provided to introduce a selection of concepts in a simplified form that are further described below in the detailed description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure.

DETAILED DESCRIPTION

The junction temperature of a laser-emitting diode (LED) or laser diode is determined using a measured forward voltage across one or more existing diodes in the package housing the emissions diode. The LED or laser diode itself is driven with a low-level reference current, and the resulting voltage across the emissions diode is determined Based on the measured voltage, the temperature across the junction of the emissions diode is calculated. The calculated temperature can be used in a feedback loop to maintain the emissions diode at a desired temperature by heating or cooling the diode package.

In one example, a method of driving a laser diode is provided that includes driving the laser diode with an operational current to cause emission by the laser diode. The laser diode emissions are paused by switching in a low-level reference current to the laser diode, followed by measuring the forward voltage across the laser diode. Using the inherent current-voltage-temperature relationship of a PN junction, the junction temperature of the laser diode is determined After switching in the low-level reference current and/or measuring the resulting forward voltage, the laser diode is again driven with the operational current to cause emissions by the laser diode.

In one example, the reference current is additionally applied to a monitor photodiode within the laser diode package. The resulting voltage across the photodiode is measured, followed by determining the junction temperature of the photodiode using the current-voltage-temperature relationship of the PN junction. An offset is applied in one embodiment, to compensate for any difference in temperature between the monitor photodiode diode and the laser diode die. In another example, the measured voltage across the laser diode and the measured voltage across the monitor photodiode are combined and used to determine the junction temperature of the laser diode. The above processes may be used for LED's as well as laser diodes.

In one example, the monitor photodiode alone is used to determine the LED or laser diode junction temperature. The operational drive current can be applied to the emissions photodiode while applying the low-level reference current to the photodiode. Using the measured forward voltage across the photodiode, the junction temperature of the emission diode is determined.

Figure 1:
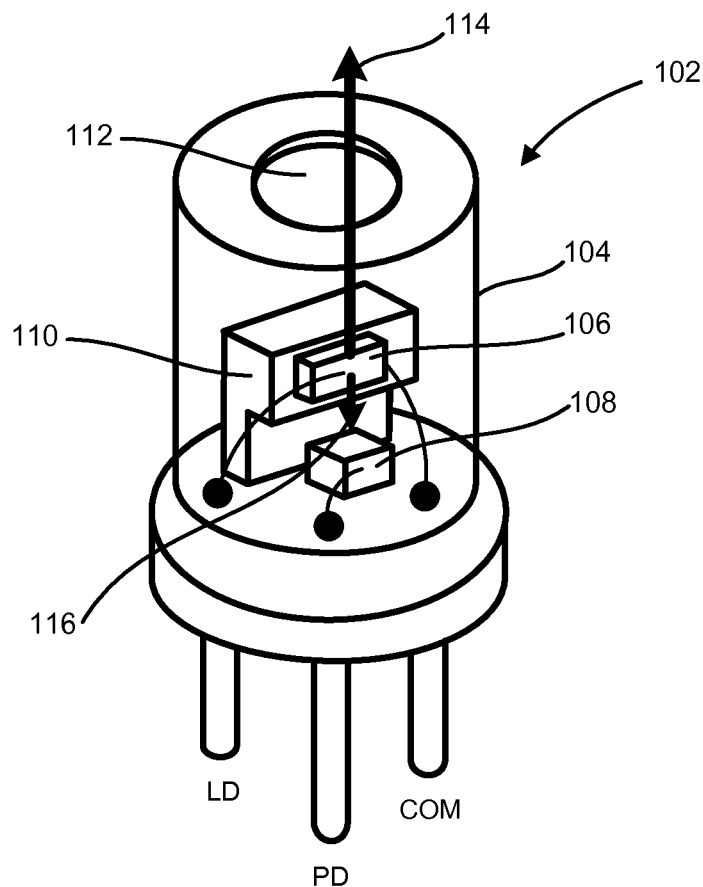
FIG. 1 is a schematic diagram of a conventional laser diode package in a perspective view.

FIG. 1 is a schematic diagram showing a typical laser diode package in a perspective view. The laser diode package 102 includes a case 104 (also called a can) which houses a die for laser diode 106, a die for monitor photodiode 108 and a heat sink 110. Heat sink 110 is used to dissipate heat generated by the laser diode die. The case includes a window 112 through which the laser beam generated by the laser diode die passes. The laser beam is represented by arrow 114 in FIG. 1. Generally, laser diodes will emit power from both ends of the resonant cavity in which the diode structure is contained. The beam or emissions from the rear facet of the laser diode in FIG. 1 is represented by arrow 116. The rear emission from laser diode 106 is monitored by a monitor photodiode 108. The photodiode utilizes optical charge carrier generation to sense and measure the light produced by the laser diode. By monitoring the output of the laser diode, the power output of the laser diode can be maintained at a constant power level using feedback control provided by an external diode driver circuit. It is noted that embodiments in accordance with the present disclosure can be used with laser diode packages that do not include a monitor photodiode as well as those that do. Furthermore, the present disclosure is equally applicable to light-emitting diodes, which share a similar configuration to that depicted in FIG. 1.

Figure 2:
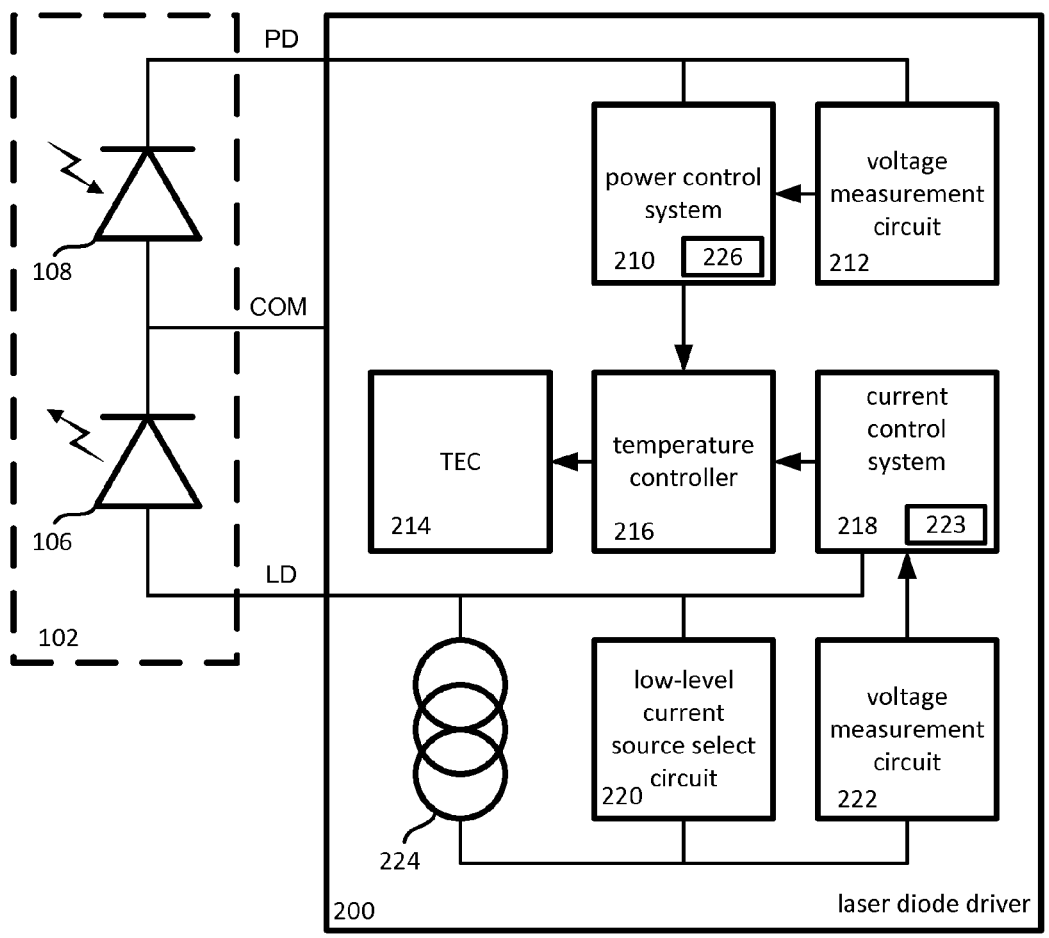
FIG. 2 is a block diagram of driver circuitry in accordance with one embodiment for driving an emissions diode package.

FIG. 2 is a block diagram of a circuit 200 for driving a laser diode package 102 in accordance with one embodiment. Laser diode 106 and monitor photodiode 108 are mounted in package 102 with leads PD, COM and LD connected to laser diode driver circuitry 200. Although the components in FIG. 2 are depicted as a single laser diode driver circuit 200, they can be incorporated in numerous variations, including within typical driver circuitry or as external components thereof. Further, although the description of FIG. 2 is presented with respect to laser diode driving circuitry, it will be appreciated that the concepts may be applied to light-emitting diode driving circuitry.

The laser diode lead LD is connected to a first lead of the driver circuitry, itself connecting to adjustable current source 224, low-level current source select circuit 220 and current control system 218. When driving laser diode 102 to produce laser emissions, current control system 218 maintains a constant current output via adjustable current source 224. The adjustable current source responds to the various control systems to drive current to laser diode 106 between a supply voltage and current source. The laser diode may be placed between the current source and ground. The actual current level through the laser diode is measured by the current control system 218 and compared with a set drive current level. The set drive current level can be represented by an analog voltage and compared with the actual current level, also represented as an analog voltage. Using the difference between the two voltages, representing an error, the output level can be adjusted.

Photodiode lead PD connects to a second lead of the driver circuitry, itself connecting to power control system 210 and a second voltage measurement circuit 212. During emissions of laser diode 106, the monitor photodiode 108 produces a current somewhat proportional to the laser diode's output optical power. Because of intrinsic differences in each laser diode package, the photodiode transfer function varies widely. The photodiode current can be measured using an ammeter within the power control circuitry and used as feedback, with the power control system trying to keep the photodiode current, and the laser diode optical power constant. The output of adjustable current source 224 may vary to keep the optical power level the same.

During operation of the laser diode package, driver circuitry 200 utilizes low-level current source select circuit 220, voltage measurement circuits 212 and 222, temperature controller 216 and thermoelectric cooler (TEC) 214 to regulate the temperature of package 102. The low-level current source select circuit 220 steps down the current supplied by current source 224 to a constant low reference level. The reference current level is not enough to drive laser emissions from laser diode 106. With the reference current applied to the laser diode, the resulting forward voltage of the diode is measured using voltage measurement circuit 222. The voltage measurement circuit provides the measured voltage level to the current control system. In one embodiment, the current control system determines the junction temperature of the laser diode 106 using the measured voltage level. In another embodiment, the actual junction temperature is not calculated, but the measured forward voltage is used to correlate the junction temperature, such as by comparing the measured forward voltage to a target forward voltage corresponding to the desired operating temperature. Based on the actual junction temperature or just the measured forward voltage, temperature control for the diode package is performed by temperature controller 216. In one embodiment, thermoelectric cooler 214 includes a peltier diode operating as a heat engine in which charge carriers absorb band gap energies which are released as heat. Although TEC 214 is shown within the driver circuitry 200 in FIG. 2, it is often mechanically coupled to the case of laser diode package 102. Other temperature regulating devices such as simple fans and resistive heaters can be used to regulate temperature. In one embodiment, voltage measurement circuit 222 provides the voltage directly to the temperature controller which performs the junction temperature correlation in place of current control system 218.

The current-voltage-temperature relationship of a diode can be seen by examining the ideal diode equation set forth in equation 1:

$$I_D = I_S(e^{V_D/(nV_T)} - 1) \quad \text{equation 1}$$

$I_D$ is the diode current, $I_S$ is the reverse bias saturation current, $V_D$ is the voltage across the diode, $V_T$ is the thermal voltage and n is the emission coefficient. The thermal voltage is a known quantity, equal to about 25.85 mV at room temperature. The thermal voltage is defined by equation 2:

$$V_T kT/q \quad \text{equation 2}$$

T is the absolute temperature of the PN junction, q is the magnitude of charge on an electron and k is boltzmann's constant. When the current through the diode is a known reference current as set forth above, the junction of the temperature of the diode or PN junction can be set forth as in equation 3, where Z is a constant representing the ratio of diode current to saturation current:

$$T = ZV_D \quad \text{equation 3}$$

As such, the temperature of the junction of the diode can be represented as the product of a known constant and the measured voltage across the diode. It has been shown that generally the voltage across a silicon diode will vary at a rate of approximately −2.2 mV/° C., which can be used in equation 3 for the value of Z.

Accordingly, the junction temperature of the laser diode die can be determined by examining the voltage across the diode at a known reference current. In one embodiment the junction temperature is determined using lookup table 223 and the measured voltage level across the laser diode. The lookup table contains junction temperature values corresponding to various measured voltage levels. Using the measured voltage level as an input, the lookup table returns a correlated temperature value.

In another embodiment, the current control system does not determine the actual junction temperature, but compares the measured voltage level to a reference voltage level representing a target junction temperature. The reference voltage level can include characterizations of the device to correlate the measured voltage to the junction temperature. For example, the laser diode may be characterized by measuring the forward voltage under test conditions at various known temperatures to determine the forward voltage corresponding to the desired operating temperature. This voltage may then be used as the comparison voltage to determine whether to heat or cool the package.

Photodiode 108 may also be used to determine the junction temperature of laser diode 106. In FIG. 2, the photodiode 108 is connected to a second voltage measuring circuit 212. In one embodiment, a single voltage measurement circuit is used in place of voltage measurement circuit 212 and voltage measurement circuit 222. Low-level current source select circuit can switch in the low-level reference current to be applied across the photodiode. With the known low-level reference current applied, measurement circuit 212 determines the resulting forward voltage. The voltage measurement circuit provides the measured voltage level to power control system 210, which will correlate the measure voltage level to the junction temperature of the laser diode. In one example, the power control system utilizes lookup table 226 to determine the laser diode junction temperature based on the measured voltage of the photodiode. Because the photodiode typically is formed on a separate die from the laser diode, the lookup table may incorporate an offset to compensate for variations between the die. During characterization of the diode package, the lookup table can be propagated by correlating measured voltages of the photodiode to known temperatures of the laser diode to determine the corresponding values. As with the laser diode, the control system may not determine the actual junction temperature in one embodiment, but instead use the measured voltage directly in a feedback loop to regulate the diode package temperature. The measured voltage can be compared with a known voltage corresponding to the desired temperature to regulate the package temperature. Voltage management circuit 212 can provide the measured voltage to temperature controller 216 in one embodiment, which will perform the junction temperature correlation in place of power control system 210.

In one embodiment, both the photodiode 108 and laser diode 106 can be used to determine the junction temperature of the laser diode. For example, the junction temperature as determined by the photodiode can be combined with the junction temperature as determined using the laser diode to determine the actual junction temperature of the laser diode. In another example, the measured voltage across the photodiode is compared with a known photodiode voltage corresponding to the desired operating temperature of the package to determine a difference between the two. The measured voltage across the laser diode can be compared with a known laser diode voltage corresponding to the desired operating temperature of the package to determine a difference between the two. The two differences can be combined to an overall voltage difference value. The overall voltage difference value can be used as an input into the feedback loop to regulate the package temperature. Similarly, a combination of both measured voltages (e.g., an average) can be used as the input to a lookup table to determine junction temperature values.

Figure 3:
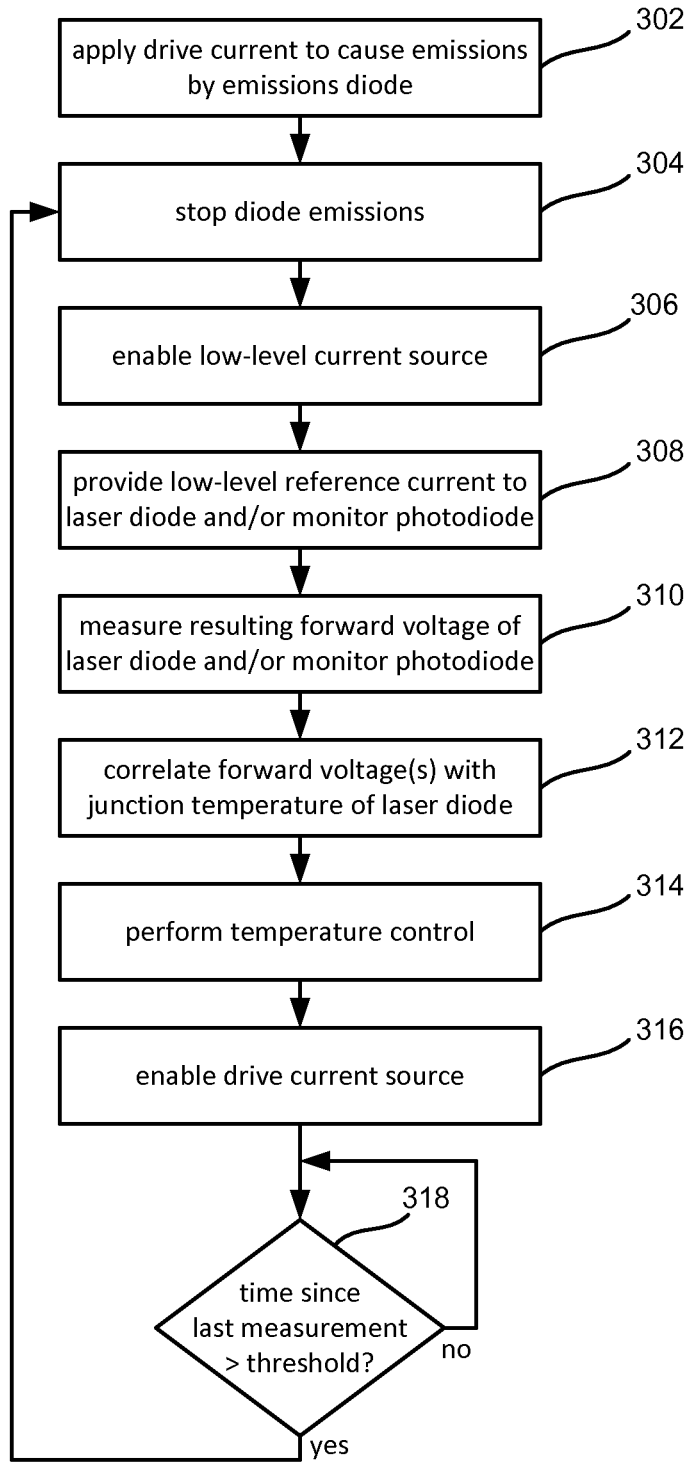
FIG. 3 is a flowchart describing a method of determining the junction temperature of an LED or laser diode in accordance with one embodiment.

FIG. 3 is a flowchart describing a method of determining the junction temperature of an LED or laser diode in accordance with one embodiment of the present disclosure. At step 302, the emissions diode is driven with a drive current sufficient to cause laser or light emissions from the diode. As will be described hereinafter, the actual value of the drive current may be unknown in some implementations, such as where characterization of the device results in setting the drive current to meet some output specification (e.g., lasing wavelength, light output level) and not maintaining an indication of the drive current level within the emissions diode package.

At step 304, laser or light emissions by the emissions diode are switched off or stopped. At step 306, a low-level current source is enabled and at step 308, a low-level reference current is applied to the emissions diode and optionally, to a monitor photodiode in the diode package with the emissions diode. It is noted that steps 304-308 may comprise a single operation whereby the drive current is switched off and the low-level reference current is driven on the input line(s) of the diode package. After applying the low-level reference current to the emissions diode and optionally the photodiode, the resulting forward voltage across the emissions diode and optionally the photodiode is measured at step 310.

At step 312, the measured forward voltage(s) is correlated to the junction temperature of the emissions diode. In one embodiment, correlating the measured forward voltage to the junction temperature includes using the measured voltage and reference current in the current-voltage-temperature relationship of the diode to determine the junction temperature. The correlation may be based on the measured forward voltage of the emissions diode and/or the measured forward voltage of the monitor photodiode. If both voltages are used, they may be averaged or combined in some other predetermined relationship to determine a voltage level to be used in looking up a corresponding junction temperature. Step 312 may include accessing a lookup table using one, both or a combination of the measured voltage levels to determine a junction temperature value. In one example, both voltages can be used to lookup a corresponding junction temperature and then the two temperature values can be averaged or combined in some other predetermined manner to determine the junction temperature of the emissions diode. In another embodiment, the actual junction temperature is not determined, but the measured voltage(s) is compared with a reference voltage level corresponding to a known temperature quantity to determine whether the junction temperature is above or below the known temperature quantity. Again, one, both or a combination of the measured voltage levels may be used as the comparison against the known temperature quantity. The two measured levels may be combined into a single value for comparison (e.g, by averaging) or each may independently compared to the reference voltage level to determine whether the junction temperature is above or below the known temperature quantity.

At step 314, temperature control or regulation of the diode package is performed based on correlating the forward voltage(s) to the junction temperature of the diode. If step 312 includes determining the actual junction temperature, such as by accessing a lookup table, step 314 can include heating or cooling the diode package based on the actual junction temperature. If the actual junction temperature is greater than the target operating temperature, the package can be cooled. If the actual junction temperature is less than the target operating temperature, the package can be heated. If step 312 does not include determining the actual junction temperature, but instead, comparing the measured voltage with a predetermined reference voltage corresponding to the target operating temperature, step 314 can include heating or cooling the diode based on this comparison. As shown above, the junction temperature of a diode will decrease at a rate of about 2.2 mV/° C. Accordingly, if the measured voltage is greater than the reference voltage, the junction temperature is lower than the target operating temperature and the package can be heated. If the measured voltage is less than the reference voltage, the junction temperature is greater than the target operating temperature and the package can be cooled. In addition to or in place of directly heating or cooling the diode package, the temperature control at step 314 can include adjusting the power applied to the emission diode from driver circuitry 200.

At step 316, the drive current is reapplied to the diode package to cause emissions by the emissions diode. Although step 316 is shown as being performed after the temperature control at step 314, the drive current may be reapplied anytime after measuring the forward voltage(s) at step 310. At step 318, it is determined whether the time since the last junction temperature measurement is greater than a threshold time. If the time is not greater than the threshold, the method waits without performing another measurement. When the time is greater than the threshold, the method continues at step 304 by stopping diode emissions to prepare for the voltage measurement at the low-level reference current.

Figure 4:
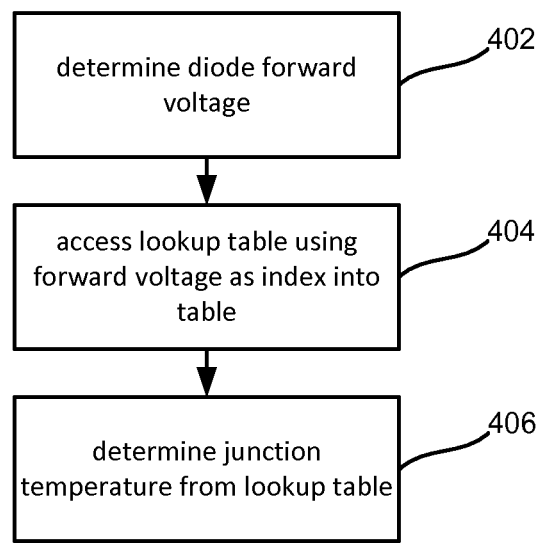
FIG. 4 is a flowchart depicting one embodiment for correlating a measured forward voltage of an emissions diode to the junction temperature of the emissions diode.

FIG. 4 is a flowchart depicting one embodiment for correlating a measured forward voltage of an emissions diode to the junction temperature of the emissions diode, as can be performed at step 312 of FIG. 3. At step 402, the emissions diode forward voltage is determined from the measurement taken at step 310. After determining the emissions diode forward voltage, a lookup table is accessed at step 404 using the measured forward voltage as an index into the table. At step 406, the junction temperature of the emissions diode is determined from the entry corresponding to the measured forward voltage.

In one embodiment, the lookup table is populated with entries during characterization of the diode package. Under test conditions, the voltage across the emissions diode can be measured under known temperatures. The measured voltages can be used as the index for the lookup table, with the corresponding temperature as the lookup value. Extrapolation can be used to build a comprehensive table of many temperature values without performing measurements at every temperature to be included in the table.

While FIG. 4 describes determining the emissions diode junction temperature based on the measured voltage of the emissions diode, similar steps can be performed to determine the emissions diode junction temperature based on a measured voltage of a monitor photodiode included in the emissions diode package. The measured forward voltage of the photodiode can be determined, followed by accessing a lookup table using the measured voltage to determine a corresponding junction temperature of the emissions diode. The lookup table for the photodiode can be different than the lookup table for the emissions diode and contain values based on a characterization that includes the photodiode. The photodiode forward voltage can be measured at known temperatures of the emissions diode to develop values for the index of the lookup table. If the forward voltages of both the photodiode and the emissions diode are measured, the method of FIG. 4 can include accessing different lookup tables to determine a junction temperature based on the measured forward voltage of the photodiode and a junction temperature based on the measured forward voltage of the emissions diode. The two junction temperatures can be combined by averaging or applying another predetermined relationship to determine a final junction temperature value for the emissions diode. In another example, the two measured voltage values can be combined, then the combined value used as an index into a lookup table to determine the junction temperature of the emissions diode.

In FIG. 4, the measured forward voltage of one or more diodes in the package is utilized to determine the junction temperature of the emissions diode. In other embodiments, the junction temperature is not explicitly determined, and the measured forward voltage itself is used to regulate the package temperature, as set forth in the example of FIG. 5 which can be performed for step 314 of FIG. 3. At step 502, the diode forward voltage is determined from the measurement taken at step 310. At step 504, the diode forward voltage is compared with a reference forward voltage corresponding to a target operating temperature of the diode package. In one embodiment, the target operating temperature and its corresponding reference forward voltage can be determined during a characterization of the diode package. The target operating temperature can be selected for the desired lasing wavelength of a laser diode or a target light or spectral output for a light-emitting diode. With the target operating temperature selected, the corresponding forward voltage level can be determined by measuring the forward voltage under application of the low-level reference current at the target operating temperature.

At step 506, it is determined whether the measured forward voltage is equal to the reference voltage level based on the comparison at step 504. If the measured forward voltage is equal to the reference voltage, it is determined at step 508 that the junction temperature of the emissions diode is equal to the target operating temperature. If the measured forward voltage is not equal to the reference voltage level, it is determined at step 510 whether the measured forward voltage is greater than or less than the reference voltage level. If the measured forward voltage is greater than the reference voltage level, it is determine at step 512 that the junction temperature is less than the target operating temperature. If the measured forward voltage is less than the reference voltage level, it is determined at step 514 that the junction temperature is greater than the target operating temperature.

Figure 5:
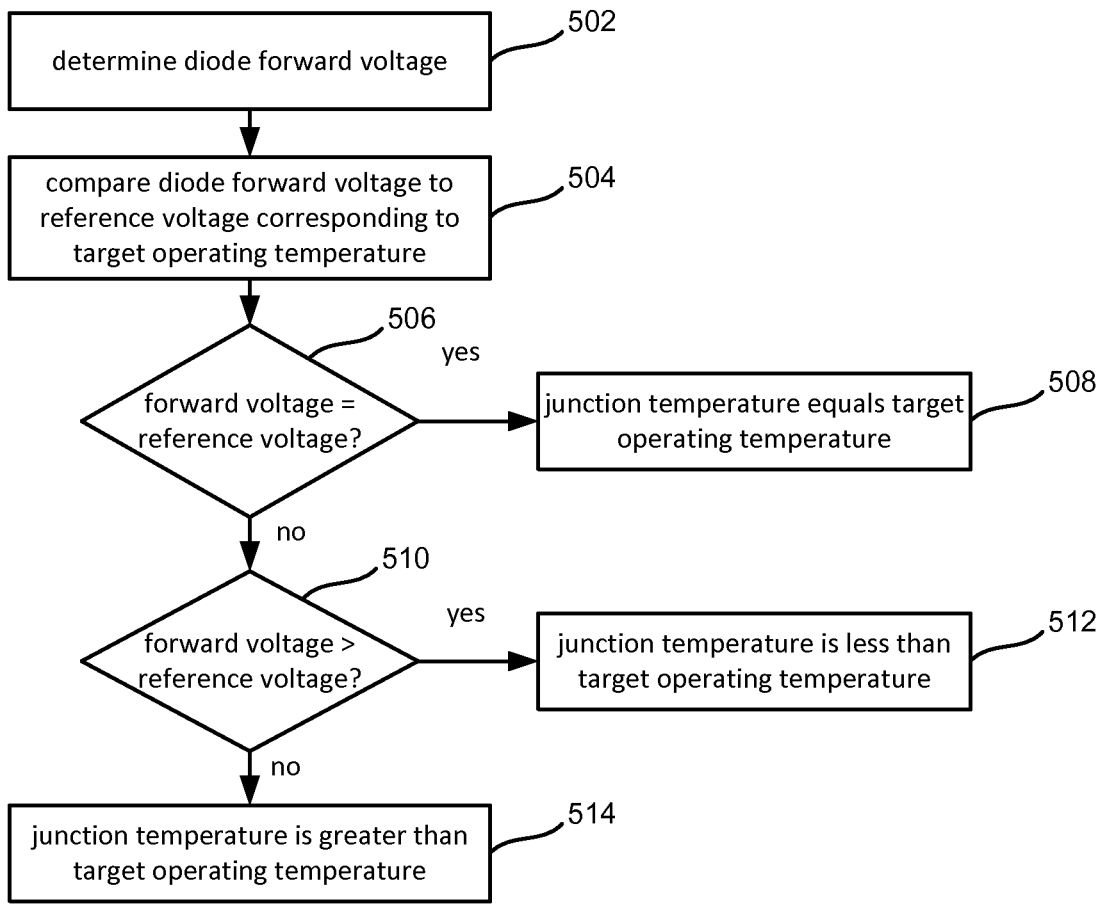
FIG. 5 is a flowchart depicting one embodiment of correlating the measured forward voltage of a diode to junction temperature without actually calculating the junction temperature.

The forward voltage utilized in FIG. 5 can be the measured forward voltage of the emissions diode in the diode package or a monitor photodiode in the package. If the monitor photodiode is utilized, the reference voltage used in the comparison can be a reference forward voltage of the photodiode determined to correspond to the target operating temperature of the diode package or the emissions diode. The reference voltage can be determined during a characterization of the diode package. In one embodiment, both the measured forward voltage of the emissions diode and the monitor photodiode can be used to correlate junction temperature. In such a case, the measured forward voltage of both diodes is compared to a reference voltage level. The reference voltage level can be the same or different for each diode. Each comparison will yield a difference (if any) between the reference voltage level and the corresponding measured voltage level. If the combined difference indicates a voltage greater than a combined reference voltage corresponding to the target operating temperature, the emissions diode temperature is determined to be less than the target operating temperature. If the combined difference indicates a voltage less than the combined reference voltage, the junction temperature of the emissions diode is determined to be greater than the target operating temperature.

Figures 6, 7:
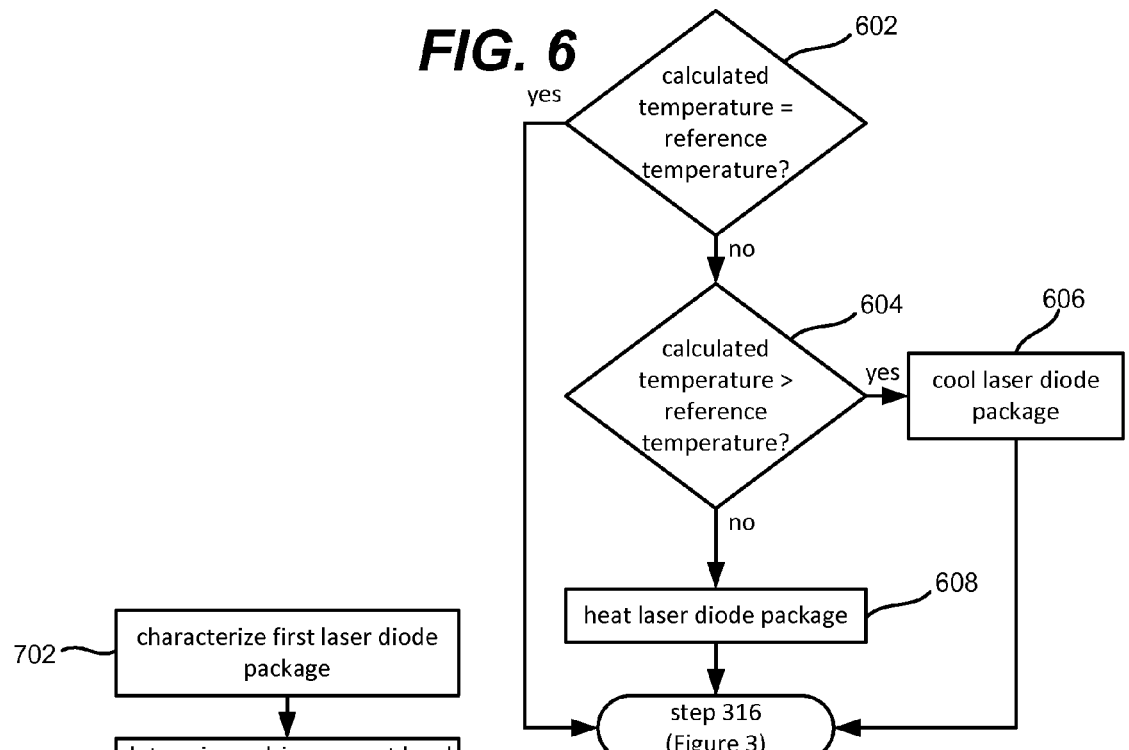
FIG. 6 is a flowchart depicting a method of performing temperature control in accordance with one embodiment.
FIG. 7 is a flowchart depicting a method of characterizing and setting driver currents for multiple diode packages.

FIG. 6 is a flowchart depicting a method for performing temperature control, as may be executed at step 314 of FIG. 3. At step 602, it is determined whether the calculated junction temperature is equal to a reference or target operating temperature for the diode package. In an alternate embodiment, step 602 can include determining whether the measured forward voltage of the emissions diode is equal to a reference voltage level. If the calculated junction temperature is equal to the reference temperature level (or if the measured voltage equals the reference voltage), the temperature of the package is unaffected and the method continues at step 316 by enabling the drive current source. If the calculated junction temperature is not equal to the target operating temperature, it is determined whether the calculated temperature is greater than the reference temperature at step 604. If the temperature is greater than the reference, the laser diode package is cooled at step 606. If the temperature is less than the reference, the package is heated at step 608. Again, the comparison at step 604 may be of the measured forward voltage and a reference voltage rather than direct temperatures. If the measured forward voltage is greater than the reference voltage, the diode package is heated at step 608. If the measured forward voltage is less than the reference voltage, the diode package is cooled at step 606. After heating or cooling the diode package, the method continues at step 316 of FIG. 3 by enabling the drive current source.

As already noted, a low-level reference current is applied to the emissions diode in various embodiments to determine the junction temperature using the current-voltage-temperature relationship inherent in all PN junctions. FIG. 7 demonstrates a benefit of such a technique, particularly in an application where diode package lots are used to manufacture products and the individual diode packages have different operating characteristics, which is typical of manufactured packages. In the particular example of FIG. 7, each laser diode package is incorporated into a device and needs to produce a predetermined target emission wavelength.

At step 702, a first laser diode package is characterized. As part of the characterization, the operational bias conditions needed to produce the target emission wavelength by the laser diode are determined. At step 704, the drive current level for the laser diode that results in the target emission wavelength is determined Step 704 may include measuring the optical output of the laser diode under test conditions to determine the drive current level that produces the target wavelength. At step 706, the drive current level as determined at step 704 is set for the driver circuitry of the first laser diode package. Step 706 can include setting adjustable parameters within the diode driver circuitry to produce the desired drive current level.

At step 708, a second laser diode package is characterized and at step 710, a drive current level for the second laser diode package that results in the target emission wavelength is determined. At step 712, the drive current level determined in step 710 is set for the driver circuitry of the second laser diode package. Individual diode packages will naturally contain variances that result in different drive current levels to produce the same emission wavelength. As such, the diode driver circuitry for the first and second laser diode packages may produce different drive currents for their corresponding diode package. In a typical scenario, the operations in FIG. 7 would be repeated many more times for additional diode packages.

By utilizing a low-level reference current for the junction temperature measurements, standard circuitry and calculations can be utilized for the different driver circuits to determine the junction temperature. An indication of the actual drive current level need not be maintained with the driver circuitry. This can be contrasted with techniques that may drive the diode package at full power with the drive current and measure the resulting voltage across the emissions diode to determine junction temperature. If a calculation is to be done at full drive current and power to determine junction temperature, the drive current level needs to be known. If the drive current level for two packages is different, each driver circuit needs to maintain an indication of the drive current level to be used in temperature calculations. In the presently disclosed embodiments however, a single low-level reference current can be used for multiple packages such that the driver circuitry for each can be the same, even where the drive current levels are different.

Figure 8:
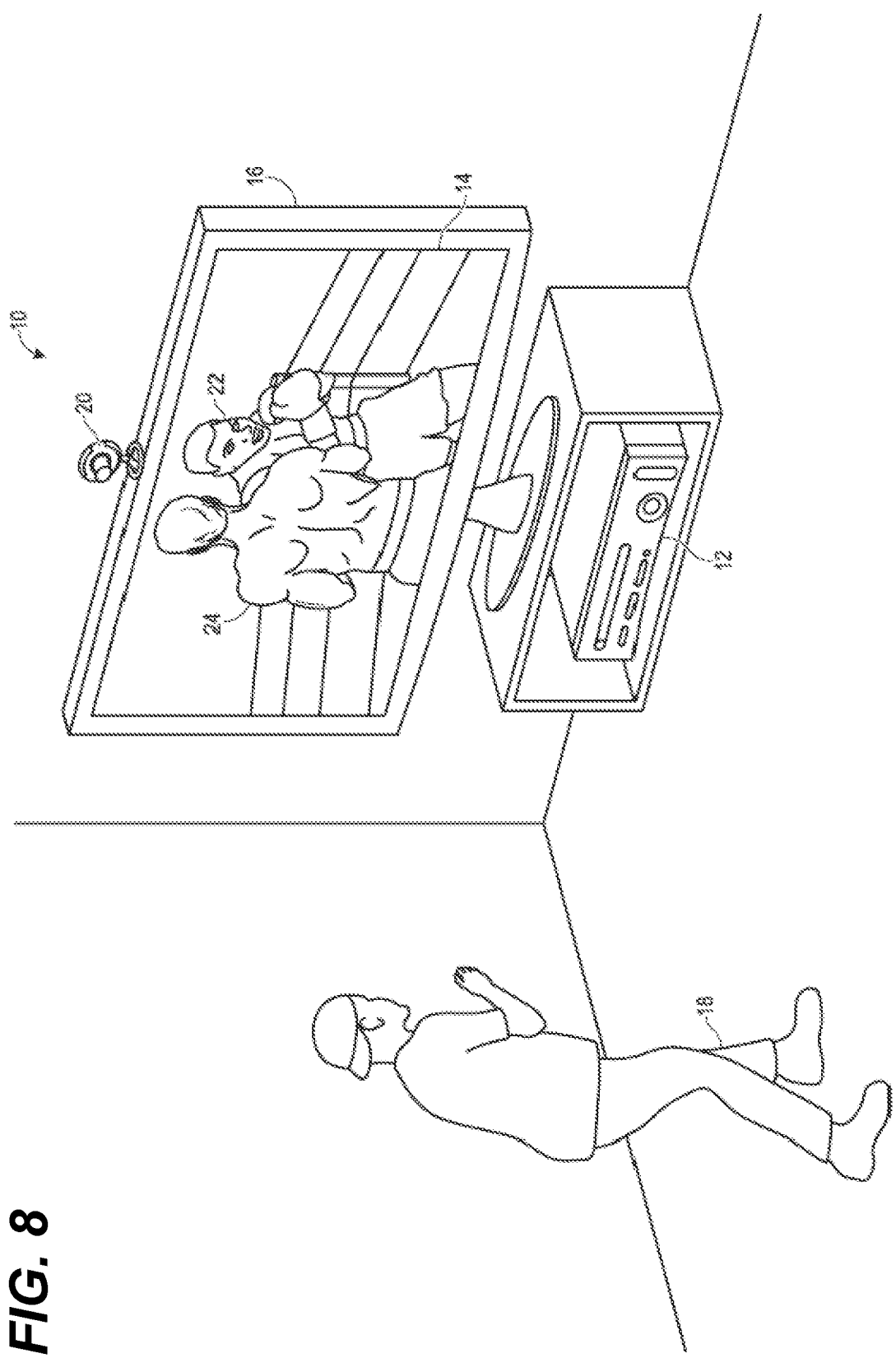
FIG. 8 illustrates a tracking system with a user playing a game.
Figure 9:
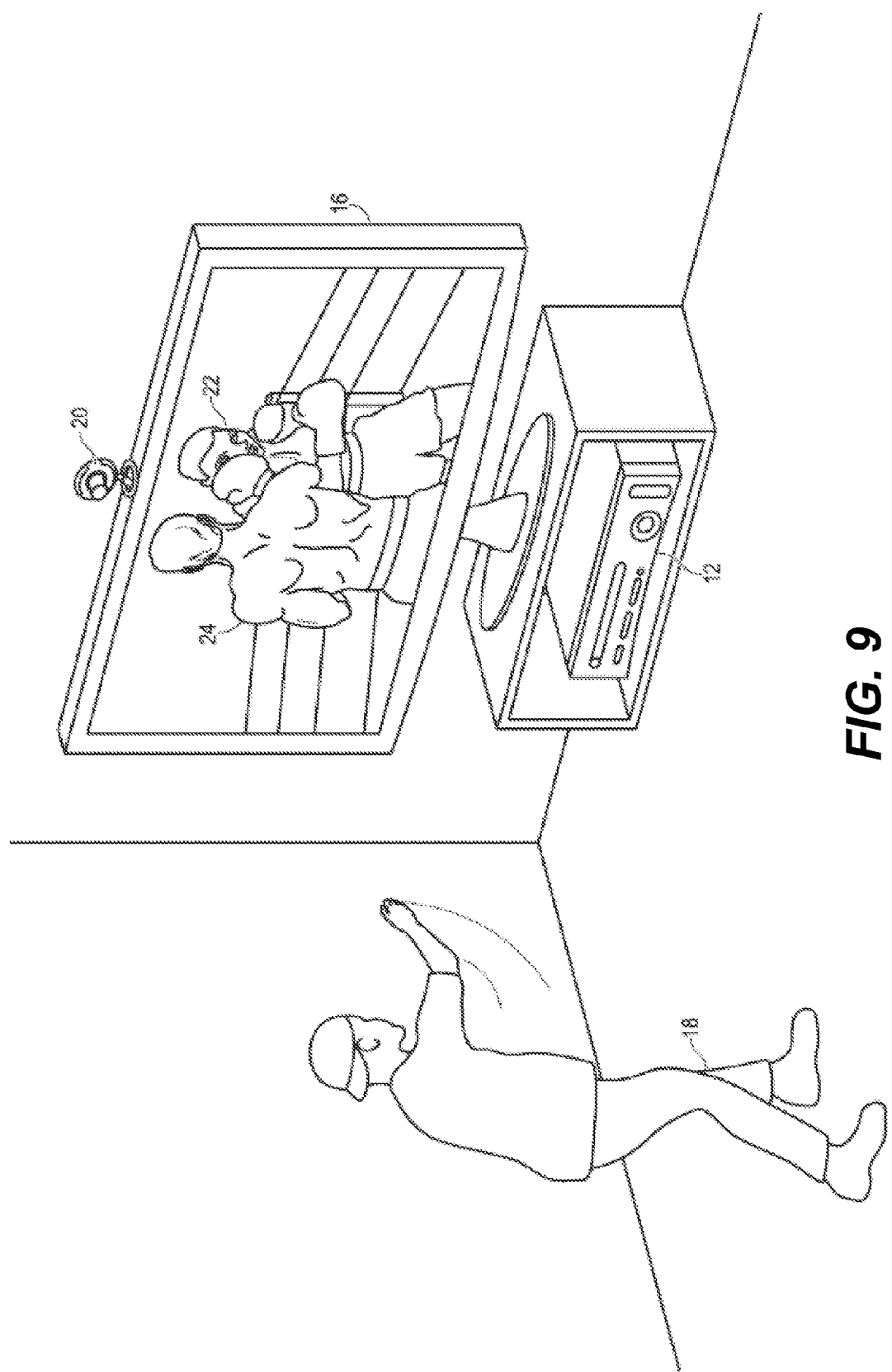
FIG. 9 illustrates a tracking system with a user playing a game.
Figure 10:
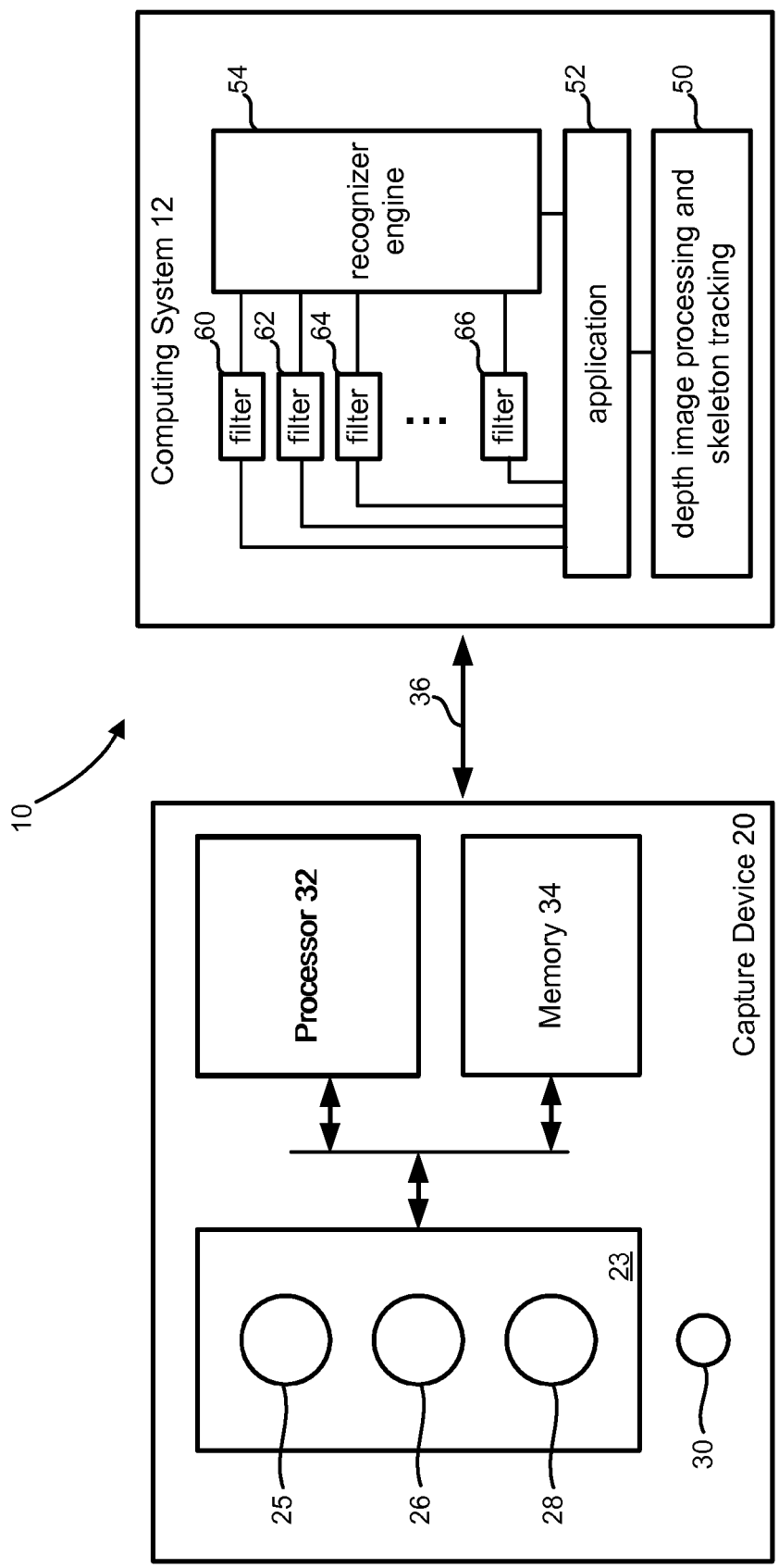
FIG. 10 illustrates a capture device that may be used as part of a tracking system.

FIGS. 8-10 depict an exemplary system, namely a tracking system using depth images, where the junction temperature calculations detailed above may be used. Tracking systems for human targets have a number of uses, including but not limited to gaming systems. FIGS. 8 and 9 illustrate a system 10 with a user 18 playing a boxing game. Such a system 10 may be used to recognize, analyze, and/or track a human target such as the user 18 or other objects within range of tracking system 10.

As shown in FIG. 8, tracking system 10 may include a computing system 12. The computing system 12 may be a computer, a gaming system or console, or the like. According to one example, the computing system 12 may include hardware components and/or software components such that computing system 12 may be used to execute applications such as gaming applications, non-gaming applications, or the like. In one embodiment, computing system 12 may include a processor such as a standardized processor, a specialized processor, a microprocessor, or the like that may execute instructions stored on a processor readable storage device for performing the processes described herein.

As shown in FIG. 8, tracking system 10 may further include a capture device 20. The capture device 20 may be, for example, a camera that may be used to visually monitor one or more users, such as the user 18, such that gestures and/or movements performed by the one or more users may be captured, analyzed, and tracked to perform one or more controls or actions within the application and/or animate an avatar or on-screen character.

According to one embodiment, the tracking system 10 may be connected to an audio/visual device 16 such as a television, a monitor, a high-definition television (HDTV), or the like that may provide game or application visuals and/or audio to a user such as the user 18. For example, the computing system 12 may include a video adapter such as a graphics card and/or an audio adapter such as a sound card that may provide audio/visual signals associated with the game application, non-game application, or the like. The audio/visual device 16 may receive the audio/visual signals from the computing system 12 and may then output the game or application visuals and/or audio associated with the audio/visual signals to the user 18. According to one embodiment, the audio/visual device 16 may be connected to the computing system 12 via, for example, an S-Video cable, a coaxial cable, an HDMI cable, a DVI cable, a VGA cable, component video cable, or the like.

As shown in FIGS. 8 and 9, the tracking system 10 may be used to recognize, analyze, and/or track a human target such as the user 18. For example, the user 18 may be tracked using the capture device 20 such that the gestures and/or movements of user 18 may be captured to animate an avatar or on-screen character and/or may be interpreted as controls that may be used to affect the application being executed by computer environment 12. Thus, according to one embodiment, the user 18 may move his or her body to control the application and/or animate the avatar or on-screen character. Similarly, tracking system 10 may be used to recognize, analyze, and/or track persons who are watching user 18 play the game so that movement by those persons watching user 18 play the game will control movement avatars in the audience at the boxing game displayed on audio/visual device 16.

In the example depicted in FIGS. 8 and 9, the application executing on the computing system 12 may be a boxing game that the user 18 is playing. The computing system 12 may use the audio/visual device 16 to provide a visual representation of a boxing opponent 22 to the user 18. The computing system 12 may also use the audio/visual device 16 to provide a visual representation of a user avatar 24 that the user 18 may control with his or her movements. For example, as shown in FIG. 9, the user 18 may throw a punch in physical space to cause the user avatar 24 to throw a punch in game space. Thus, according to an example embodiment, the computer system 12 and the capture device 20 recognize and analyze the punch of the user 18 in physical space such that the punch may be interpreted as a game control of the user avatar 24 in game space and/or the motion of the punch may be used to animate the user avatar 24 in game space.

Other movements by the user 18 may also be interpreted as other controls or actions and/or used to animate the user avatar, such as controls to bob, weave, shuffle, block, jab, or throw a variety of different power punches. Furthermore, some movements may be interpreted as controls that may correspond to actions other than controlling the user avatar 24. For example, in one embodiment, the user may use movements to end, pause, or save a game, select a level, view high scores, communicate with a friend, etc. According to another embodiment, the user may use movements to select the game or other application from a main user interface. Thus, in one example, a full range of motion of the user 18 may be available, used, and analyzed in any suitable manner to interact with an application.

In one example, the human target such as the user 18 may have an object. In such embodiments, the user of an electronic game may be holding the object such that the motions of the user and the object may be used to adjust and/or control parameters of the game. For example, the motion of a user holding a racket may be tracked and utilized for controlling an on-screen racket in an electronic sports game. In another example embodiment, the motion of a user holding an object may be tracked and utilized for controlling an on-screen weapon in an electronic combat game. Objects not held by the user can also be tracked, such as objects thrown, pushed or rolled by the user (or a different user) as well as self propelled objects. In addition to boxing, other games can also be implemented.

According to other examples, the tracking system 10 may further be used to interpret target movements as operating system and/or application controls that are outside the realm of games. For example, virtually any controllable aspect of an operating system and/or application may be controlled by movements of the target such as the user 18.

FIG. 10 illustrates an example of the capture device 20 that may be used in the tracking system 10. According to an example, the capture device 20 may be configured to capture video with depth information including a depth image that may include depth values via any suitable technique including, for example, time-of-flight, structured light, stereo image, or the like. According to one embodiment, the capture device 20 may organize the depth information into "Z layers," or layers that may be perpendicular to a Z axis extending from the depth camera along its line of sight.

As shown in FIG. 10, the capture device 20 may include an image camera component 23. According to an example, the image camera component 23 may be a depth camera that may capture a depth image of a scene. The depth image may include a two-dimensional (2-D) pixel area of the captured scene where each pixel in the 2-D pixel area may represent a depth value such as a distance in, for example, centimeters, millimeters, or the like of an object in the captured scene from the camera.

As shown in FIG. 10, according to an example, the image camera component 23 may include an infra-red (IR) light component 25, a three-dimensional (3-D) camera 26, and an RGB camera 28 that may be used to capture the depth image of a scene. For example, in time-of-flight analysis, the IR light component 25 of the capture device 20 may emit infrared light at a predetermined wavelength onto the scene to illuminate the scene and one or more targets and objects in the scene. Sensors (not shown) are then used to detect the backscattered light from the surface of one or more targets and objects in the scene using, for example, the 3-D camera 26 and/or the RGB camera 28. In some embodiments, pulsed infrared light may be used such that the time between an outgoing light pulse and a corresponding incoming light pulse may be measured and used to determine a physical distance from the capture device 20 to a particular location on the targets or objects in the scene. Additionally, in other examples, the phase of the outgoing light wave may be compared to the phase of the incoming light wave to determine a phase shift. The phase shift may then be used to determine a physical distance from the capture device to a particular location on the targets or objects.

According to another example, time-of-flight analysis may be used to indirectly determine a physical distance from the capture device 20 to a particular location on the targets or objects by analyzing the intensity of the reflected beam of light over time via various techniques including, for example, shuttered light pulse imaging.

In another example, the capture device 20 may use a structured light to capture depth information. In such an analysis, patterned light (i.e., light displayed as a known pattern such as grid pattern, a stripe pattern, or different pattern) may be projected onto the scene via, for example, the IR light component 25. Upon striking the surface of one or more targets or objects in the scene, the pattern may become deformed in response. Such a deformation of the pattern may be captured by, for example, the 3-D camera 26 and/or the RGB camera 28 (and/or other sensor) and may then be analyzed to determine a physical distance from the capture device to a particular location on the targets or objects. In some implementations, the IR Light component 25 is displaced from the cameras 24 and 26 so triangulation can be used to determined distance from cameras 26 and 28. In some implementations, the capture device 20 will include a dedicated IR sensor to sense the IR light, or a sensor with an IR filter.

In one embodiment, the infra-red (IR) light component 25 may include at least one laser diode package for generating and emitting the infra-red light. In tracking applications that utilize such IR light components, the operational precision of the laser diode may be of increased importance as compared with other applications. In such cases, the emissions of the laser diode may need to be held at a constant wavelength. Because the wavelength of the diode's emissions will vary with temperature, regulating the temperature of the diode package takes on significance. Accordingly, in one embodiment, a laser diode IR light component 25 is maintained at a target operating temperature by utilizing the junction temperature calculations detailed above so that the emission wavelength of the diode is held constant or substantially constant. Further, because a manufacturer may build multiple tracking systems, with individual diode packages having unique operating characteristics, the drive current levels for different devices may vary as noted above. Accordingly, the use of a low-level reference current enables multiple devices to be manufactured with different drive current levels, while enabling temperature calculations to be done using standard drive circuitry. In alternate techniques whereby a full drive current is used to determine junction temperature, individual parameters need to be maintained including the drive current level so that the junction temperature can be calculated.

The capture device 20 may further include a microphone 30. The microphone 30 may include a transducer or sensor that may receive and convert sound into an electrical signal. According to one embodiment, the microphone 30 may be used to reduce feedback between the capture device 20 and the computing system 12 in the target recognition, analysis, and tracking system 10. Additionally, the microphone 30 may be used to receive audio signals that may also be provided by to computing system 12.

In an example, the capture device 20 may further include a processor 32 that may be in communication with the image camera component 23. The processor 32 may include a standardized processor, a specialized processor, a microprocessor, or the like that may execute instructions including, for example, instructions for receiving a depth image, generating the appropriate data format (e.g., frame) and transmitting the data to computing system 12.

The capture device 20 may further include a memory component 34 that may store the instructions that are executed by processor 32, images or frames of images captured by the 3-D camera and/or RGB camera, or any other suitable information, images, or the like. According to an example embodiment, the memory component 34 may include random access memory (RAM), read only memory (ROM), cache, flash memory, a hard disk, or any other suitable storage component. As shown in FIG. 10, in one embodiment, memory component 34 may be a separate component in communication with the image capture component 23 and the processor 32. According to another embodiment, the memory component 34 may be integrated into processor 32 and/or the image capture component 23.

As shown in FIG. 10, capture device 20 may be in communication with the computing system 12 via a communication link 36. The communication link 36 may be a wired connection including, for example, a USB connection, a Firewire connection, an Ethernet cable connection, or the like and/or a wireless connection such as a wireless 802.11b, g, a, or n connection. According to one embodiment, the computing system 12 may provide a clock to the capture device 20 that may be used to determine when to capture, for example, a scene via the communication link 36. Additionally, the capture device 20 provides the depth information and visual (e.g., RGB) images captured by, for example, the 3-D camera 26 and/or the RGB camera 28 to the computing system 12 via the communication link 36. In one embodiment, the depth images and visual images are transmitted at 30 frames per second. The computing system 12 may then use the model, depth information, and captured images to, for example, control an application such as a game or word processor and/or animate an avatar or on-screen character.

Computing system 12 includes depth image processing and skeletal tracking module 50, which uses the depth images to track one or more persons detectable by the depth camera. Depth image processing and skeletal tracking module 50 provides the tracking information to application 52, which can be a video game, productivity application, communications application or other software application, etc. The audio data and visual image data is also provided to application 52 and depth image processing and skeletal tracking module 50. Application 52 provides the tracking information, audio data and visual image data to recognizer engine 54. In another embodiment, recognizer engine 54 receives the tracking information directly from depth image processing and skeletal tracking module 50 and receives the audio data and visual image data directly from capture device 20. Recognizer engine 54 is associated with a collection of filters 60, 62, 64, . . . , 66, each comprising information concerning a gesture or other action or event that may be performed by any person or object detectable by capture device 20. For example, the data from capture device 20 may be processed by the filters 60, 62, 64, . . . , 66 to identify when a user or group of users has performed one or more gestures or other actions. Those gestures may be associated with various controls, objects or conditions of application 52. Thus, the computing environment 12 may use the recognizer engine 54, with the filters, to interpret movements.

Capture device 20 of FIG. 10 provides RGB images (or visual images in other formats or color spaces) and depth images to computing system 12. A depth image may be a plurality of observed pixels where each observed pixel has an observed depth value. For example, the depth image may include a two-dimensional (2-D) pixel area of the captured scene where each pixel in the 2-D pixel area may have a depth value such as distance of an object in the captured scene from the capture device.

The system will use the RGB images and depth images to track a user's movements. For example, the system will track a skeleton of a person using a depth images. There are many methods that can be used to track the skeleton of a person using depth images. One suitable example of tracking a skeleton using depth images is provided in U.S. patent application Ser. No. 12/603,437, "Pose Tracking Pipeline," filed on Oct. 21, 2009. (hereinafter referred to as the '437 Application), incorporated herein by reference in its entirety. The process of the '437 Application includes acquiring a depth image, down sampling the data, removing and/or smoothing high variance noisy data, identifying and removing the background, and assigning each of the foreground pixels to different parts of the body. Based on those steps, the system will fit a model with the data and create a skeleton. The skeleton will include a set of joints and connections between the joints. Suitable tracking technology is also disclosed in U.S. patent application Ser. No. 12/475,308, "Device for Identifying and Tracking Multiple Humans Over Time," filed on May 29, 2009, incorporated herein by reference in its entirety; U.S. patent application Ser. No. 12/696,282, "Visual Based Identity Tracking," filed on Jan. 29, 2010, incorporated herein by reference in its entirety; U.S. patent application Ser. No. 12/641,788, "Motion Detection Using Depth Images," filed on Dec. 18, 2009, incorporated herein by reference in its entirety; and U.S. patent application Ser. No. 12/575,388, "Human Tracking System," filed on Oct. 7, 2009, incorporated herein by reference in its entirety.

Gesture recognizer engine 54 (of computing system 12 depicted in FIG. 2) is associated with multiple filters 60, 62, 64, . . . , 66 to identify a gesture or action. A filter comprises information defining a gesture, action or condition along with parameters, or metadata, for that gesture, action or condition. For instance, a throw, which comprises motion of one of the hands from behind the rear of the body to past the front of the body, may be implemented as a gesture comprising information representing the movement of one of the hands of the user from behind the rear of the body to past the front of the body, as that movement would be captured by the depth camera. Parameters may then be set for that gesture. Where the gesture is a throw, a parameter may be a threshold velocity that the hand has to reach, a distance the hand must travel (either absolute, or relative to the size of the user as a whole), and a confidence rating by the recognizer engine that the gesture occurred. These parameters for the gesture may vary between applications, between contexts of a single application, or within one context of one application over time. In one embodiment, a filter has a number of inputs and a number of outputs.

Filters may be modular or interchangeable so that a first filter may be replaced with a second filter that has the same number and types of inputs and outputs as the first filter without altering any other aspect of the recognizer engine architecture. For instance, there may be a first filter for driving that takes as input skeletal data and outputs a confidence that the gesture associated with the filter is occurring and an angle of steering. Where one wishes to substitute this first driving filter with a second driving filter—perhaps because the second driving filter is more efficient and requires fewer processing resources—one may do so by simply replacing the first filter with the second filter so long as the second filter has those same inputs and outputs—one input of skeletal data type, and two outputs of confidence type and angle type.

A filter need not have a parameter. For instance, a "user height" filter that returns the user's height may not allow for any parameters that may be tuned. An alternate "user height" filter may have tunable parameters—such as to whether to account for a user's footwear, hairstyle, headwear and posture in determining the user's height.

Inputs to a filter may comprise things such as joint data about a user's joint position, like angles formed by the bones that meet at the joint, RGB color data from the scene, and the rate of change of an aspect of the user. Outputs from a filter may comprise things such as the confidence that a given gesture is being made, the speed at which a gesture motion is made, and a time at which a gesture motion is made.

Gesture recognizer engine 54 provides functionality to the filters. In one embodiment, the functionality that the recognizer engine 54 implements includes an input-over-time archive that tracks recognized gestures and other input, a Hidden Markov Model implementation (where the modeled system is assumed to be a Markov process—one where a present state encapsulates any past state information necessary to determine a future state, so no other past state information must be maintained for this purpose—with unknown parameters, and hidden parameters are determined from the observable data), as well as other functionality to solve particular instances of gesture recognition.

Filters 60, 62, 64, . . . , 66 are loaded and implemented on top of recognizer engine 54 and can utilize services provided by recognizer engine 54 to all filters 60, 62, 64, . . . 66. In one embodiment, recognizer engine 54 receives data to determine whether it meets the requirements of any filter 60, 62, 64, . . . , 66. Since these provided services, such as parsing the input, are provided once by recognizer engine 54, rather than by each filter 60, 62, 64, . . . , 66, such a service need only be processed once in a period of time as opposed to once per filter for that period so the processing to determine gestures is reduced.

Application 52 may use the filters 60, 62, 64, . . . , 66 provided by the recognizer engine 54, or it may provide its own filters which plugs into recognizer engine 54. In one embodiment, all filters have a common interface to enable this plug-in characteristic. Further, all filters may utilize parameters, so a single gesture tool below may be used to debug and tune the entire filter system.

More information about recognizer engine 54 can be found in U.S. patent application Ser. No. 12/422,661, "Gesture Recognizer System Architecture," filed on Apr. 13, 2009, incorporated herein by reference in its entirety. More information about recognizing gestures can be found in U.S. patent application Ser. No. 12/391,150, "Standard Gestures," filed on Feb. 23, 2009; and U.S. patent application Ser. No. 12/474, 655, "Gesture Tool" filed on May 29, 2009. Both of which are incorporated by reference herein in their entirety.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. It is intended that the scope of the invention be defined by the claims appended hereto.

We claim:

1. A circuit, comprising:
an emission diode;
a photodiode;
a voltage measurement circuit configured to measure at least one of a forward voltage of the emission diode or a forward voltage of the photodiode; and
a control circuit configured to control an operating temperature of the emission diode based on the at least one measured forward voltage and a target operating temperature that is equal to a characterized operating temperature of the emission diode when producing emissions at a predetermined wavelength.

2. The circuit of claim 1, wherein:
the at least one measured forward voltage includes the measured forward voltage of the emission diode;
the emission diode comprises a diode junction; and
the measured forward voltage of the emission diode is across the diode junction of the emission diode.

3. The circuit of claim 2, wherein:
the control circuit controls the operating temperature of the emission diode based on the measured forward voltage of the emission diode and the target operating temperature by comparing the measured forward voltage of the emission diode to a reference forward voltage of the emission diode that corresponds to the target operating temperature.

4. The circuit of claim 1, wherein:
the at least one measured forward voltage includes the measured forward voltage of the photodiode;
the photodiode comprises a diode junction; and
the measured forward voltage of the photodiode is across the diode junction of the photodiode.

5. The circuit of claim 4, wherein:
the control circuit controls the operating temperature of the emission diode based on the measured forward voltage of the photodiode and the target operating temperature by comparing the measured forward voltage of the photodiode to a reference forward voltage of the photodiode that corresponds to the target operating temperature.

6. The circuit of claim 1, wherein:
the at least one measured forward voltage includes the measured forward voltage of the photodiode and the measured forward voltage of the photodiode.

7. The circuit of claim 1, further comprising:
a current source coupled to the emission diode and the photodiode, the current source configured to switchably supply a drive current to the emission diode and a reference current to at least one of the emission diode or the photodiode.

8. The circuit of claim 1, wherein:
the drive current is configured to cause emissions by the emission diode; and
the reference current is configured not to cause emissions by the emission diode.

9. The circuit of claim 1, further comprising:
a lookup table;
wherein the control circuit is configured to determine a junction temperature of the emission diode from the lookup table based on the measured forward voltage of the emission diode.

10. A circuit, comprising:
an emission diode;
a current source coupled to the emission diode, the current source configured to switchably supply a drive current and configured to supply a reference current;
a voltage measurement circuit configured to measure a forward voltage of the emission diode; and
a control circuit configured to control an operating temperature of the emission diode based on the measured forward voltage of the emission diode and a target operating temperature that is equal to a characterized operating temperature of the emission diode when producing emissions at a predetermined wavelength.

11. The circuit of claim 10, wherein:
the voltage measurement circuit is configured to measure the forward voltage of the emission diode while the reference current is supplied to the emission diode, and while the drive current is not supplied to the emission diode.

12. The circuit of claim 10, wherein:
the emission diode comprises a diode junction; and
the measured forward voltage of the emission diode is across the diode junction.

13. The circuit of claim 10, further comprising:
a photodiode;
wherein the voltage measurement circuit is further configured to measure a forward voltage of the photodiode; and
wherein the control circuit is further configured to control the operating temperature of the emission diode based on the measured forward voltage of the photodiode.

14. The circuit of claim 13, wherein:
the voltage measurement circuit is configured to measure the forward voltage of the emission diode while the reference current is supplied to the emission diode, and while the drive current is not supplied to the emission diode; and
the voltage measurement circuit is configured to measure the forward voltage of the photodiode while the reference current is supplied to the photodiode, and while the drive current is not supplied to the emission diode.

15. A circuit, comprising:
an emission diode;
a photodiode;
a current source coupled to the emission diode, the current source configured to switchably supply a drive current for the emission diode and configured to switchably supply a reference current for the photodiode;
a voltage measurement circuit configured to measure a forward voltage of the photodiode; and
a control circuit configured to control an operating temperature of the emission diode based on the measured forward voltage of the photodiode and a target operating temperature that is equal to a characterized operating temperature of the emission diode when producing emissions at a predetermined wavelength.

16. The circuit of claim 15, wherein the voltage measurement circuit is further configured to measure the forward voltage of the photodiode while the reference current is supplied to the photodiode, and while the drive current is not supplied to the emission diode.

17. The circuit of claim 15, wherein:
the control circuit controls the operating temperature of the emission diode based on the measured forward voltage of the photodiode and the target operating temperature by comparing the measured forward voltage of the photodiode to a reference forward voltage corresponding to the target operating temperature.

18. The circuit of claim 15, wherein:
the voltage measurement circuit is further configured to measure a forward voltage of the emission diode; and
the control circuit is further configured to control the operating temperature of the emission diode based on the measured forward voltage of the emission diode.

19. The circuit of claim 18, wherein:
the voltage measurement circuit is configured to measure the forward voltage of the photodiode while the reference current is supplied to the photodiode, and while the drive current is not supplied to the emission diode; and
the voltage measurement circuit is configured to measure the forward voltage of the emission diode while the reference current is supplied to emission diode, and while the drive current is not supplied to the emission diode.

20. The circuit of claim 15, further comprising:
a lookup table;
wherein the control circuit is configured to determine a junction temperature of the emission diode from the lookup table based on the measured forward voltage of the photodiode.

* * * * *